(12) United States Patent
Nakamura et al.

(10) Patent No.: US 7,851,382 B2
(45) Date of Patent: Dec. 14, 2010

(54) METHOD FOR MANUFACTURING SIC SEMICONDUCTOR DEVICE

(75) Inventors: Hiroki Nakamura, Handa (JP); Hideki Kawahara, Kariya (JP)

(73) Assignee: DENSO CORPORATION, Kariya (JP)

( * ) Notice: Subject to any disclaimer, the term of this patent is extended or adjusted under 35 U.S.C. 154(b) by 154 days.

(21) Appl. No.: 12/155,020

(22) Filed: May 29, 2008

(65) Prior Publication Data

US 2008/0318438 A1    Dec. 25, 2008

(30) Foreign Application Priority Data

Jun. 21, 2007    (JP)    ............... 2007-164092

(51) Int. Cl.
    *H01L 21/469*    (2006.01)
(52) U.S. Cl. ................. 438/770; 257/77; 257/E21.605
(58) Field of Classification Search ................ 438/787, 438/770, 767; 257/77, E21.301, E21.603, 257/E21.605
    See application file for complete search history.

(56) References Cited

U.S. PATENT DOCUMENTS

| 7,462,540 B2 | 12/2008 | Takahashi et al. |
| 2006/0220027 A1 | 10/2006 | Takahashi et al. |

FOREIGN PATENT DOCUMENTS

| JP | A-2005-260267 | 9/2005 |
| JP | A-2005-303010 | 10/2005 |
| JP | 2007-115875 | * 5/2007 |
| JP | A-2007-115875 | 5/2007 |
| JP | A-2007-281005 | 10/2007 |

OTHER PUBLICATIONS

Kostecki et al., "Surface studies of carbon films from pyrplyzed photoresist," Thin Solid Films 396 (2001), pp. 36-43.*
Shenoy et al., "Effect of substrate orientation and crystal anisotropy on the thermally oxidized SiO2/SiC interface," J.Appl.Phys. 79, 1996, pp. 3042-3045.*
Office Action mailed Dec. 15, 2009 from the Japan Patent Office for corresponding patent application No. 2007-164092 (English translation enclosed).

* cited by examiner

*Primary Examiner*—Asok K Sarkar
*Assistant Examiner*—Julia Slutsker
(74) *Attorney, Agent, or Firm*—Posz Law Group, PLC

(57) ABSTRACT

A method for manufacturing a SiC semiconductor device includes: forming an impurity layer in a SiC layer; and forming an oxide film on the SiC layer. The forming the impurity layer includes: implanting an impurity in the SiC layer; applying a cap layer on the SiC layer; annealing the cap layer to be transformed to a carbon layer; annealing the SiC layer to activate the impurity with covering the SiC layer with the carbon layer; removing the carbon layer; and performing a sacrifice oxidation process. The performing the sacrifice oxidation process includes: forming a sacrifice oxide film; and removing the sacrifice oxide film. The forming the oxide film is performed after the performing the sacrifice oxidation process.

8 Claims, 9 Drawing Sheets

METHOD FOR MANUFACTURING SIC SEMICONDUCTOR DEVICE

CROSS REFERENCE TO RELATED APPLICATION

This application is based on Japanese Patent Application No. 2007-164092 filed on Jun. 21, 2007, the disclosure of which is incorporated herein by reference.

FIELD OF THE INVENTION

The present invention relates to a method for manufacturing a SiC semiconductor device.

BACKGROUND OF THE INVENTION

A Si atom is removed from a SiC surface of a SiC power device when an activation heat treatment is performed in a step of forming an impurity layer, so that the SiC surface is roughened. When the Si atom is removed, a carbon rich layer is formed on the SiC surface. It is necessary to remove the carbon rich layer for reducing a leak current and for protecting the device from generating failure. Accordingly, to remove the carbon rich layer, a step for forming a sacrifice oxidation film and a step for removing the sacrifice oxidation film are added.

The step for forming the sacrifice oxidation film is a thermal oxidation process. In the thermal oxidation process, a region in which an impurity is implanted is oxidized with a thermal oxidation speed, which is much different from that of a region in which no impurity is implanted. Specifically, the thermal oxidation speed in the implanted region is larger than that in the non-implanted region so that the implanted region is oxidized rapidly. Accordingly, the thickness of the thermal oxidation film in the implanted region is larger than that in the non-implanted region.

Thus, when the sacrifice oxidation film is removed in a HF acid process, the implanted region provides a concavity (a constricted part), compared with the non-implanted region. This is because the thickness of the thermal oxidation film in the implanted region is large. This concavity may cause deviation of thickness in a step for forming a gate oxide film. Thus, reliability of the gate oxide film is reduced.

To improve the above difficulty, a method for reducing surface roughness is disclosed in, for example, JP-A-2005-260267. Specifically, an organic film such as a photo resist is patterned, and then, an impurity ion is implanted. After that, the organic film is carbonized so that a graphite film is formed. The graphite film is used for a mask in an annealing process with high temperature.

In the above method, the graphite film functions as a mask, and thereby, the surface roughness under the mask is improved.

Another method for improving the surface roughness is disclosed in JP-2005-303010. Specifically, after a drift layer is epitaxially grown, a Si atom is sublimated in a vacuum high temperature anneal process, so that a homogeneous carbon layer is formed. The carbon layer is used for a cap layer in an activation process, in which an impurity layer is annealed so that the impurity layer is activated. Thus, when the carbon layer is used, an impurity included in organic solvent is not diffused into the SiC substrate. This feature is similar to the graphite film. Thus, device characteristics are not deteriorated.

However, in the method disclosed in JP-A-2005-260267, the graphite film is made of the organic film having a predetermined pattern, which is used for ion implantation. Therefore, a region corresponding to the opening of the organic film for the ion implantation is not covered with the graphite film.

Thus, the Si atom is sublimated in the anneal step with high temperature from the opening that is not covered with the graphite film, and thereby, the carbon rich layer is formed in the opening. Accordingly, when the device is formed, the carbon rich layer is removed in the sacrifice oxidation process. The step for forming the sacrifice oxidation film and the step for removing the sacrifice oxidation film are added. Thus, the concavity is produced from rapid oxidation.

In the method disclosed in JP-A-2005-303010, after the carbon layer is formed, a $SiO_2$ film is formed on the carbon layer in order to perform selective ion implantation. After the film is processed by a photo etching step, the ion implantation step is performed.

When the $SiO_2$ film is formed on the carbon layer made of amorphous film, adhesiveness between the $SiO_2$ film and the carbon layer may be insufficient. Thus, when the $SiO_2$ film is processed to have a fine pattern, the $SiO_2$ film as the mask may be removed (i.e., may peel off) from the carbon layer. Thus, the $SiO_2$ film does not function as the mask sufficiently. Thus, the device performance may be reduced.

JP-A-2005-303010 teaches that ion implantation step is performed after the carbon layer is formed. Thus, the $SiO_2$ film is formed on the carbon layer, and the $SiO_2$ film is patterned in a photo etching process. Then, the ion implantation step is performed.

However, when the $SiO_2$ film is formed on the carbon layer as an amorphous layer, the adhesiveness between the $SiO_2$ film and the carbon layer is not sufficient. Thus, when the $SiO_2$ film is patterned with a fine pattern, the $SiO_2$ film as a mask is removed from the carbon layer. Thus, the $SiO_2$ film does not function as a mask for the ion implantation step, so that the performance of the device is reduced.

Further, in JP-A-2005-303010, after the ion implantation step is performed in order to form an impurity layer, the carbon layer is formed. After the drift layer is epitaxially grown, a Si component on the surface of the drift layer is sublimated so that the carbon layer is formed on the surface of the drift layer. In this case, by performing a series of steps, the carbon layer is formed. However, it is necessary to add the ion implantation step before the carbon layer is formed.

Further, when the carbon layer is formed after the ion implantation step, an impurity region is formed together with the carbon layer. Thus, in the impurity region, crystal structure is distorted. Accordingly, when the carbon layer is formed at a high temperature in a range between 1100° C. and 1400° C., carbonizing speed (or sublimation speed of the Si atom) in the impurity region is different from the SiC surface portion having proper crystal structure. Accordingly, when the carbon layer is removed, a concavity is formed, which is similar to the sacrifice oxidation step and the step for removing the sacrifice oxidation film. Thus, the thickness of the gate oxide film is deviated, and the reliability of the gate film is reduced.

SUMMARY OF THE INVENTION

In view of the above-described problem, it is an object of the present disclosure to provide a method for manufacturing a SiC semiconductor device.

According to an aspect of the present disclosure, a method for manufacturing a SiC semiconductor device includes: forming an impurity layer in a SiC semiconductor layer; and forming an oxide film on a surface of the SiC semiconductor layer. The forming the impurity layer includes: implanting an impurity in the SiC semiconductor layer; applying a cap layer made of organic solvent on the surface of the SiC semiconductor layer; annealing the cap layer to evaporate the organic solvent so that the cap layer is carbonized and transformed to a carbon layer; annealing the SiC semiconductor layer to activate the impurity in the SiC semiconductor layer under a condition that the surface of the SiC semiconductor layer is covered with the carbon layer; removing the carbon layer; and performing a sacrifice oxidation process after the removing the carbon layer. The performing the sacrifice oxidation process includes: forming a sacrifice oxide film; and removing the sacrifice oxide film. The forming the oxide film is performed after the performing the sacrifice oxidation process.

In the above method, the impurity is activated with covering the surface of the SiC semiconductor layer, and then, the carbon layer is removed. Further, the sacrifice oxidation process is performed. Thus, even if a leak path is formed in a top surface of the SiC semiconductor layer, the leak path is removed in the removing the carbon layer and the sacrifice oxidation process. Thus, a leak current is prevented in the SiC semiconductor device.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

The inventor has preliminarily studied an anneal process for activating an impurity, which has been disclosed in JP-A-2007-281005. Specifically, an impurity is implanted on a wafer, and then, a whole surface of the wafer is covered with a resist. Further, the resist is carbonized in another anneal process so that a carbon layer is formed. Then, the carbon layer is used for a mask, and the anneal process for activating the impurity is performed. More specifically, in a power MOSFET, the carbon layer is used as a mask for covering a P$^-$ conductive type base region, a N$^+$ conductive type source region, and a surface channel layer. The carbon layer is made of the carbonized resist. Thus, an impurity in each layer is activated.

When the carbon layer is used as a mask, material composing the carbon layer has excellent adhesiveness with a SiC layer, which is a substrate layer. Thus, a Si atom is prevented from being removed from the SiC surface, and a carbon rich layer is not formed on the SiC surface. Thus, it is not necessary to add a step for forming a sacrifice oxide film and a step for removing the sacrifice oxide film so as to remove the carbon rich layer. Further, a concavity is not formed, and a thickness of an oxide film is uniformed. Accordingly, reliability of the oxide film is improved, and performance of the device is also improved.

However, when the carbon layer made of a carbonized resist is used as a mask, a leak current may flow in some cases where an anneal process profile is not appropriate.

In view of the above difficulty, it is required for a manufacturing method of a SiC semiconductor device to prevent a leak current. Here, the manufacturing method includes an anneal step for activating an impurity with using a carbon layer made of a carbonized resist as a mask so that an oxide film formed on a SiC surface has a homogeneous thickness.

The inventors have preliminarily studied about a method for manufacturing a SiC semiconductor device.

Figure 11:
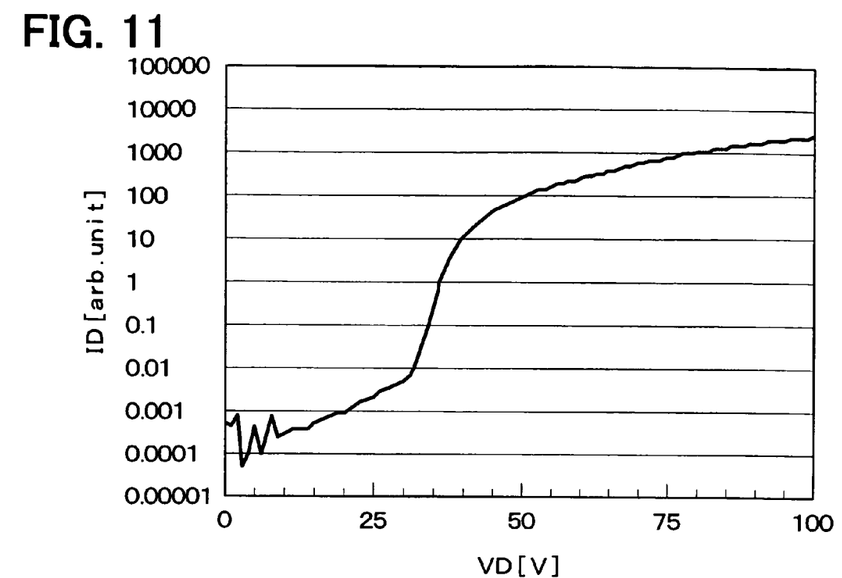
FIG. 11 is a graph showing a relationship between a drain voltage and a drain current in a power MOSFET as a comparison.
Figure 12:
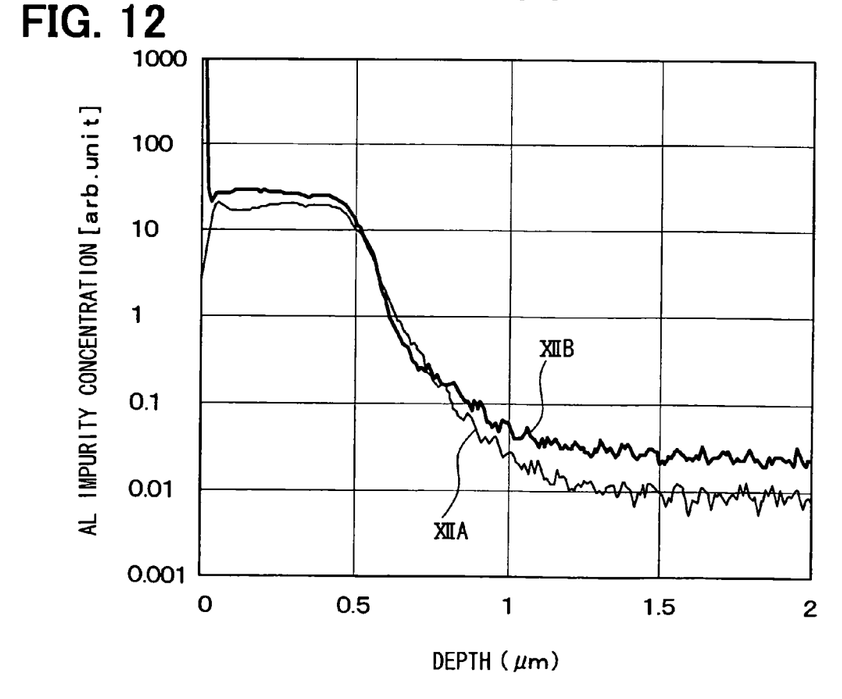
FIG. 12 is a graph showing a relationship between an impurity concentration and a depth after an ion implantation step and after an activation anneal step.

FIG. 11 shows a relationship between a drain voltage VD and a drain current ID in a power MOSFET. As shown in FIG. 11, the drain current ID is generated in the MOSFET. Further, FIG. 12 shows an impurity concentration distribution after a step XIIA of implanting an ion and after a step XIIB of annealing for activation of the impurity. The impurity concentration of a top surface of an impurity layer after the step XIIB of annealing for activation of the impurity is much larger than that after the step XIIA of implanting the ion. Here, the step XIIB of annealing for activation of the impurity is performed after the step XIIA of implanting the ion. This is because the impurity such as aluminum migrates from an inside of the impurity layer to the top surface of the impurity layer when the MOSFET is annealed for activating the impurity. Accordingly, for example, the impurity separates out (or, precipitates) at a boundary between, for example, a P− conductive type base region and a surface channel layer so that the impurity concentration at the boundary becomes high. This impurity precipitation may provide a leak path so that the precipitation causes the current leak.

Accordingly, if a surface portion of the impurity layer in which the leak path is disposed is removed, the leak current is reduced. To remove the current path effectively, a sacrifice oxide film formation step and a sacrifice oxide film removal step are performed after the anneal step for activation under a condition where the surface of the impurity layer is covered with a mask.

Here, when the anneal step for activation is performed under a condition where the mask covers the surface of the impurity layer, a silicon component is prevented from being removed from the surface of the impurity layer. Thus, it is not necessary to perform the sacrifice oxide film formation step and the sacrifice oxide film removal step, so that a concavity or a constricted part is not formed. However, if the sacrifice oxide film formation step and the sacrifice oxide film removal step are performed to remove the leak path, the concavity may be formed.

In the above case, since the anneal step for activating the impurity is performed under the condition that the surface of the impurity layer is covered with the mask, the silicon component is not substantially removed from the surface of the impurity layer, and thereby, a carbon rich layer is not formed. Thus, it is not necessary to remove the carbon rich layer. Therefore, only the leak path is removed. In a conventional art, for example, to remove the carbon layer, it is necessary to remove a part of the impurity layer in a sacrifice oxidation process, the part disposed in a 30 nm depth from the surface of the impurity layer. When the leak path is removed, it is necessary to remove a part of the impurity layer in a sacrifice oxidation process, the part disposed in a few to five nanometers depth from the surface of the impurity layer. Here, the few to five nanometers depth corresponds to almost one atomic layer. This is also known from experimental result shown in FIG. 12 that the region having the high impurity concentration in a surface portion of the impurity layer is very shallow.

Accordingly, even when the sacrifice oxide film formation step and the sacrifice oxide film removal step are performed after the anneal step for activation together with covering the surface of the impurity layer with the mask, a depth or a height of the concavity is very small. Accordingly, it is effective to cover the surface of the impurity layer with the mask during the annealing step for activation.

To reduce the leak current in the device, a method for manufacturing a SiC semiconductor device is provided. The method includes an anneal step for activating an impurity with using a carbon layer as a mask made of a carbonized resist so that a thickness of an oxide film formed on a surface of a SiC layer is controlled to reduce thickness unevenness.

First Embodiment

Figure 1:
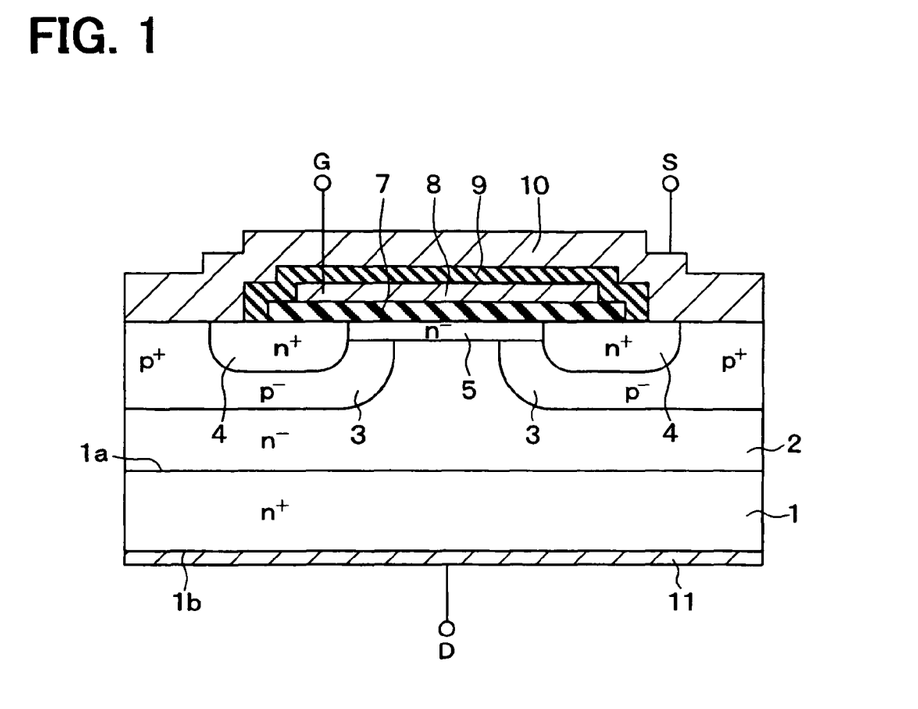
FIG. 1 is a cross sectional view showing a planar MOSFET in a SiC semiconductor device according to a first embodiment.

FIG. 1 shows a SiC semiconductor device having a normally-off type N channel planar MOSFET, which is a vertical power MOSFET. This device is suitably used for an inverter or a rectifier of a vehicle alternator.

The MOSFET includes a N$^+$ conductive type substrate 1 made of SiC. The substrate 1 has an upper side as a principal surface 1a and a lower side as a backside surface 1b, which is opposite to the principal surface 1a. An N$^-$ conductive type epitaxial layer 2 (i.e., N$^-$ epitaxial layer) made of SiC is formed on the principal surface 1a of the substrate 1. The impurity concentration (i.e., dopant concentration) of the N$^-$ epitaxial layer 2 is lower than that of the substrate 1.

A P$^-$ conductive type base region 3 is formed in a surface portion of the epitaxial layer 2. The base region 3 includes a dopant of boron, aluminum or germanium, and an impurity concentration of the base region 3 is equal to or greater than $1 \times 10^{17}$ cm$^{-3}$. The impurity concentration in the base region 3 is partially increased so that a center portion of the base region 3 has a high impurity concentration. The center portion of the base region 3 is shown as P$^+$ in FIG. 1, which is disposed on each side of the device. The center portion functions as a contact region. The depth of the center portion may be greater than other regions so that the center portion provides a deep base region.

A N$^+$ conductive type source region 4 is formed in a surface portion of the base region 3. The depth of the source region 4 is smaller than that of the base region 3. A N$^-$ conductive type SiC layer 5 is formed to protrude from the base region 3 in a surface portion of the epitaxial layer 2 so that the SiC layer 5 connects the source region 4 and the epitaxial layer 2. The SiC layer 5 is epitaxially grown, and functions as a channel forming layer in case of operation of the device. The SiC layer 5 provides a surface channel layer 5.

A gate oxide film 7 is formed on the upper surface of the surface channel layer 5 and the upper surface of the source region 4, and a gate electrode 8 is formed on the gate oxide film 7. The gate electrode 8 is covered with an insulation film 9 made of LTO (i.e., low temperature oxide). A source electrode 10 is formed on the insulation film 9 such that the source electrode 10 is electrically connected to the source region 4 and the base region 3. A drain electrode 11 is formed on the backside surface 1b of the substrate 1. Thus, the vertical MOSFET is constructed.

A manufacturing method of the power MOSFET is explained as follows with reference to FIGS. 2A to 5C.

Figure 2A:
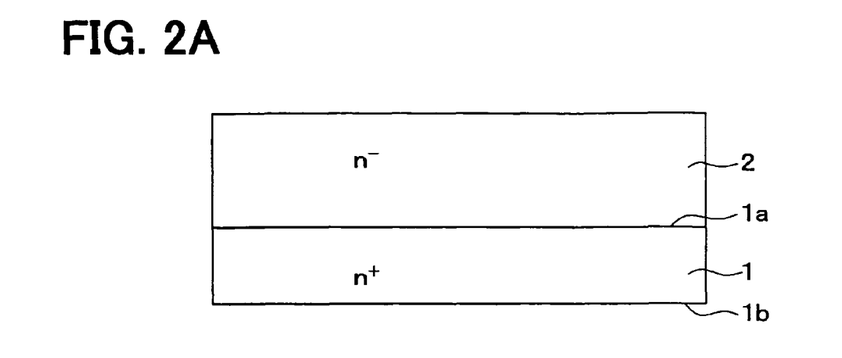
FIGS. 2A to 2C are cross sectional views showing a method for manufacturing the vertical power MOSFET shown in FIG. 1.

In a step shown in FIG. 2A, the semiconductor substrate 1 made of N conductive type 4H—, 6H— or 3C—SiC is prepared. For example, the thickness of the substrate 1 is about 400 μm. The epitaxial layer 2 having a thickness of 5 μm is epitaxially grown on the principal surface 1a of the substrate 1. In this case, the crystal structure of the epitaxial layer 2 is the same as the substrate 1 so that the epitaxial layer 2 is made of N conductive type 4H—, 6H—, or 3C—SiC.

Figure 2B:
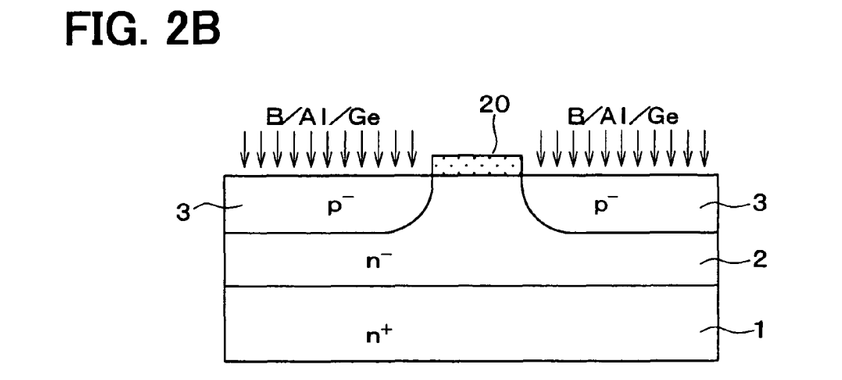
Figure 2C:
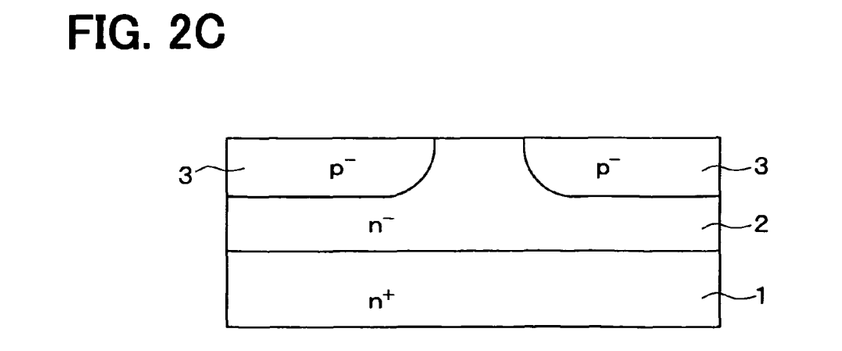

In steps shown in FIGS. 2B and 2C, a LTO film 20 is arranged on the epitaxial layer 2, and the LTO film 20 is patterned so that a base-region-to-be-formed region is exposed from the LTO film 20. By using the LTO film 20 as a mask, a P conductive type impurity of boron, aluminum or germanium is implanted on the epitaxial layer 2. The ion implantation condition is such that, for example, temperature is 700° C., and a dose amount is $1 \times 10^{16}$ cm$^{-2}$. Thus, the P$^-$ conductive type base region 3 is formed. After that, the LTO film 20 is removed.

Figure 4A:
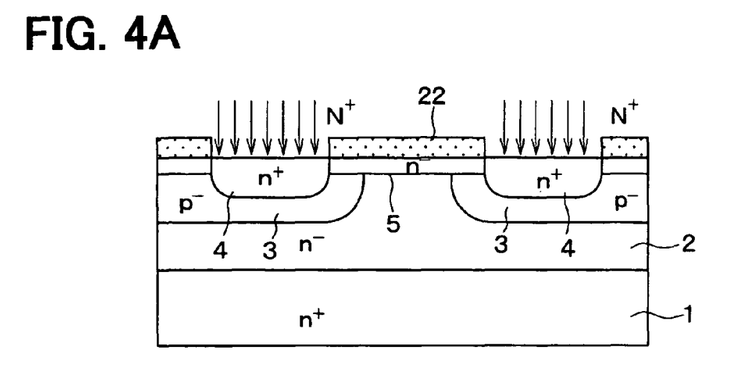
FIGS. 4A to 4C are cross sectional views showing the method for manufacturing the vertical power MOSFET shown in FIG. 1.
Figure 4B:
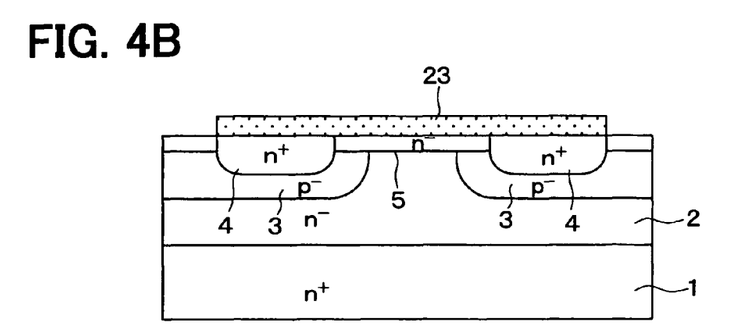

In a step shown in FIG. 4B, the LTO film 20 is removed by a HF processing step. Then, a resist 21 is formed on the base region 3. In this case, it is preferably to form the resist 21 by using a spin coat method or a spray coating method because the thickness of the resist 23 is homogeneous.

The resist 21 is made from organic solvent, which is carbonized after organic matter in the organic solvent is vaporized. Here, the organic solvent is a positive type organic solvent such as an I-line photo lithography resist, a deep-UV lithography resist, an ArF lithography resist or an electron beam lithography resist.

Figure 6:
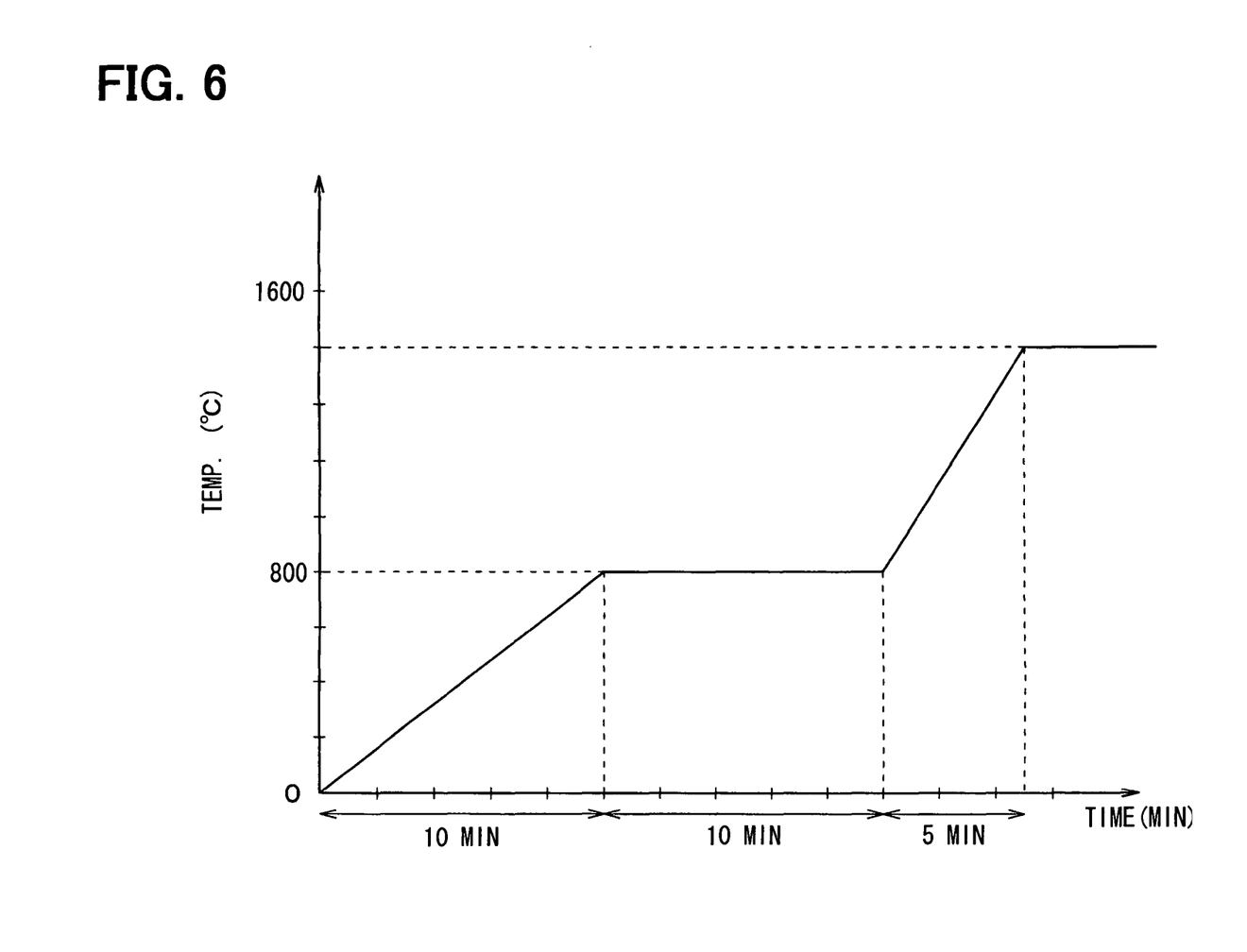
FIG. 6 is a graph showing an annealing process profile in the method for manufacturing the vertical power MOSFET.

Based on an anneal process profiling shown in FIG. 6, the organic matter in the resist 21 is vaporized, so that the carbon layer is formed by carbonizing the resist 21. Further, the impurities in the base region 3 are activated.

Specifically, atmosphere pressure in equipment for performing the anneal step is reduced so that the pressure in the equipment is equal to or lower than $1 \times 10^{-4}$ Pa. Thus, the equipment is vacuumed and depressurized. Then, argon gas is introduced into the equipment so that the inside of the equipment is filled with the argon gas. Then, the equipment is heated in such a manner that the temperature of the equipment is equal to or higher than 200° C. and equal to or lower than 850° C. The temperature increase rate is equal to or lower than 80° C./min. For example, the temperature of the equipment is increased with the temperature increase rate of 80° C./min for ten minutes, so that the temperature of the equipment reaches 800° C. Then, the temperature at 800° C. is maintained.

The temperature increase profile is used for carbonizing the resist 21, so that the anneal temperature of 800° C. is lower than that of a step for activating the impurity, and further, the temperature increase rate of 80° C./min is smaller than that of the step for activating the impurity. The anneal temperature is set to be in a range between 200° C. and 850° C. because the resist 21 is sufficiently carbonized at that temperature before the impurity is activated. The temperature increase rate is set to be equal to or lower than 80° C./min. If the temperature increase rate is high, the organic matter in the resist 21 is rapidly boiled, and thereby, a bubble generated by rapid boiling may break the resist 21.

Further, since the anneal temperature equal to or lower than 850° C. is maintained for a predetermined time duration, the organic matter in the resist 21 is surely vaporized. Thus, the carbon layer made of the carbonized resist 21 is surely formed. Further, since the atmosphere in the equipment is argon, residual oxygen amount is small in the equipment. Therefore, when the carbon layer is formed, the resist 21 does not burn with the residual oxygen.

Since the carbon layer is made of the carbonized resist 21, the carbon layer can cover a whole surface of the base region 3.

After the carbon layer is formed, the temperature increase rate may be set to be large. Specifically, after formation of the carbon layer, the temperature increase rate is set to be equal to or larger than 160° C./min so that the temperature of the equipment increases to the anneal process temperature, at which the impurity is activated. For example, the equipment is heated with the temperature increase rate of 160° C./min for five minutes so that the temperature of the equipment increases from 800° C. to 1600° C. Thus, the impurity in the base region 3 is activated.

At this time, since the carbon layer covers the base region 3, the silicon component is prevented from being removed from each surface of the base region 3. Thus, the carbon rich layer is not formed on the surface of the base region 3.

Further, the carbon layer has good adhesiveness with SiC material, which provides a base such as the base region 3. The carbon layer does not remove from the base, and covers the base sufficiently. Thus, the anneal process for activating the impurity is performed with covering the base sufficiently.

Figure 3A:
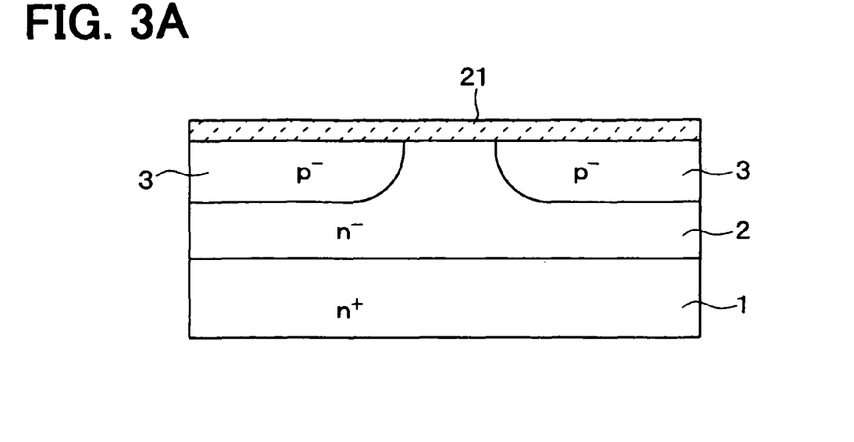
FIGS. 3A to 3C are cross sectional views showing the method for manufacturing the vertical power MOSFET shown in FIG. 1.
Figure 3B:
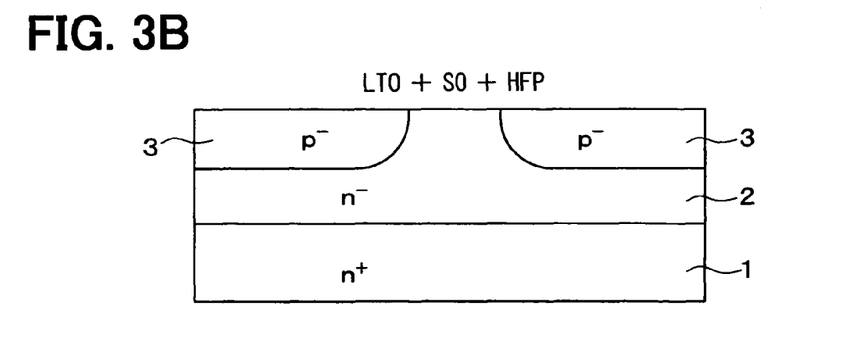

In a step shown in FIG. 3B, the impurity in the base region 3 is activated with using the carbon layer as the mask for covering the surface of the base region 3. Then, the carbon layer is removed in a low temperature oxidation process and a sacrifice oxidation process having high temperature oxidation step. Thus, two-step oxidation process is performed to remove the carbon layer.

Specifically, the low temperature oxidation process is performed to remove the carbon layer. This process is performed such that the thermal oxidation process is performed at temperature equal to or lower than 1000° C., at which the SiC material is not oxidized and the silicon component is not removed. For example, the thermal oxidation process is performed at 800° C., so that the carbon layer burns. Thus, the carbon layer is removed. The thermal oxidation process for removing the carbon layer may be performed by a dry oxidation process or a wet oxidation process.

Successively, the temperature of the substrate 1 is increased from the process temperature of the low temperature oxidation process. Then, a sacrifice oxide film is formed on a surface of a wafer in the high temperature oxidation step of the sacrifice oxidation process. Then, a step for removing the sacrifice oxide film is performed. Specifically, the sacrifice oxide film is formed in an anneal step at temperature equal to or higher than 1000° C., at which the SiC layer can be oxidized. For example, the anneal step is performed at 1080° C. so that the sacrifice oxide film is formed. Then, the sacrifice oxide film is removed in the HF processing. Further, the HF processing provides to clean the surface of the substrate 1. Thus, the carbon layer made of carbonized resist is used as the mask when the impurity is activated in the anneal step. At this time, a leak path formed by migration of the impurity to a top surface portion of the base region 3 is removed. Here, the top surface portion is disposed in a few to five nanometers. Accordingly, a leak current can be reduced. The leak current is attributed to the leak path in the top surface portion of the impurity layer.

Since the annealing process for activating the impurity is performed with covering with the mask, the silicon component is prevented from being removed. Further, the carbon rich layer is not formed, and therefore, it is necessary to remove only the leak path. In a conventional art, for example, to remove the carbon rich layer, it is necessary to remove a part of the impurity layer in a sacrifice oxidation process, the part disposed in a 30 nm depth from the surface of the impurity layer. When only the leak path is removed, it is necessary to remove a part of the impurity layer in a sacrifice oxidation process, the part disposed in a few to five nanometers depth from the surface of the impurity layer.

Accordingly, after the annealing process for activating the impurity is performed with covering with the mask, the sacrifice oxidation process including the sacrifice oxide film formation step and the sacrifice oxide film removal step may be performed. Even in such a case, an oxidation process time duration in the sacrifice oxide film formation step is very short, compared with the conventional method. Thus, a height of the concavity is much smaller than that of the conventional method.

Figure 3C:
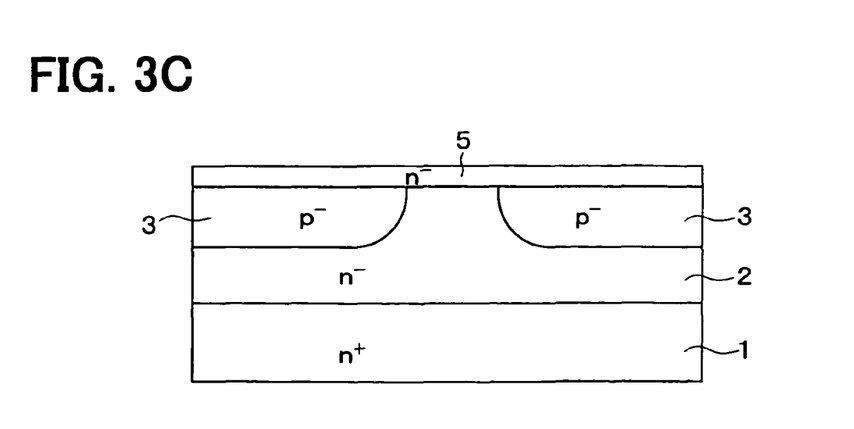

In a step shown in FIG. 3C, a surface channel layer 5 is epitaxially grown on the base region 3 and on the epitaxial layer 2.

Here, to provide a normally-off type vertical power MOSFET, the thickness of the surface channel layer 5 is smaller than a sum of extent of a depletion layer from the base region 3 and extent of the depletion layer from the gate oxide film 7. The depletion layer extends from the base region 3 to the surface channel layer 5, and extends from the gate oxide film 7 to the surface channel layer 5, when a voltage is not applied to the gate electrode 8.

Specifically, the extent of the depletion layer from the base region is determined by a built-in voltage of a PN junction between the surface channel layer 5 and the base region 3. The extent of the depletion layer from the gate oxide film 7 is determined by a difference of work function between the gate electrode 8 and the surface channel layer 5 and by a charge on the gate oxide film 7. Thus, the thickness of the surface channel layer 5 is determined based on the above factors.

The normally-off type vertical power MOSFET can prevent the current from flowing therethrough even if the MOSFET is broken and not able to apply a voltage to the gate electrode. Therefore, the normally-off type MOSFET ensures the safety, compared with a normally-on type MOSFET.

In a step shown in FIG. 4A, the LTO film 22 is formed on the surface channel layer 5, and then, the LTO film 22 is patterned so that a source-region-to-be-formed region is exposed from the LTO film 22. The LTO film 22 is used for a mask, and an N conductive type impurity such as a nitride ion is implanted, so that the $N^+$ conductive type source region 4 is formed. The ion implantation condition is such that temperature is 700° C., and a dose amount is $1 \times 10^{15}$ $cm^{-2}$.

In a step shown in FIG. 4B, the LTO film 22 is removed, and then, another LTO film 23 is formed on the surface channel layer 5 by using a photo lithography method. The LTO film 23 is patterned so that a part of the surface channel layer 5 corresponding to a contact region between the base region 3 and the source electrode 10 is exposed from the LTO film 23.

Figure 4C:
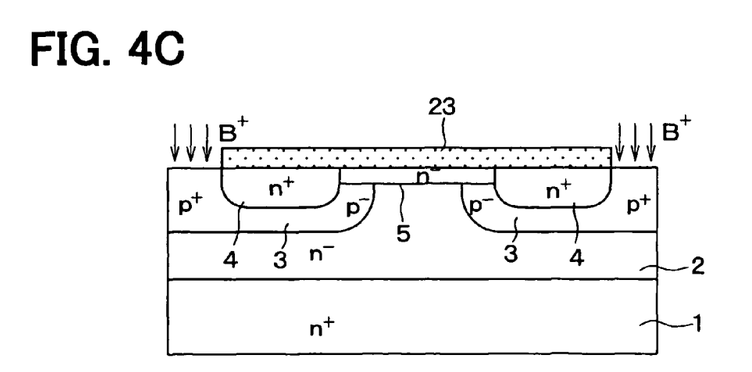

In a step shown in FIG. 4C, the LTO film 23 is used for a mask, and a B+ ion is implanted on the part of the surface channel layer 5 disposed on the base region 3. Thus, a contact region having a high impurity concentration of the P conductive type impurity is formed in the part of the base region 3, which is not overlapped with the source region 4.

Figure 5A:
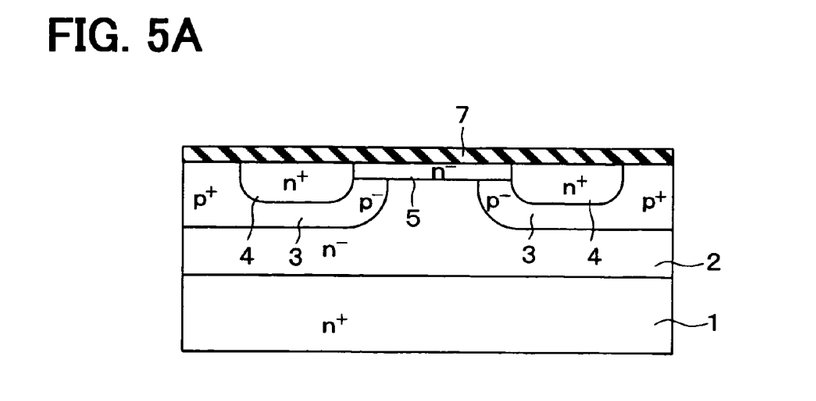
FIGS. 5A to 5C are cross sectional views showing the method for manufacturing the vertical power MOSFET shown in FIG. 1.

Then, for example, in a step shown in FIG. 5A, the gate oxide film 7 is formed on the base region 3, the source region 4 and the surface channel layer 5 in a wet oxidation process including a pyrogenic method at atmospheric temperature of 1080° C. In the pyrogenic method, mixture of oxygen gas and hydrogen gas is used.

Figure 5B:
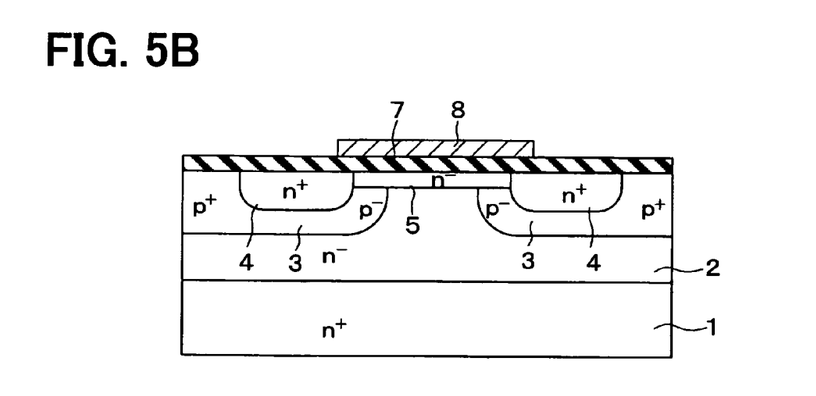

In a step shown in FIG. 5B, a poly silicon layer is formed on the gate oxide 7 by a LPCVD method or the like. In this case, the deposition temperature is, for example, 600° C. The poly silicon layer is patterned, so that the gate electrode 8 is formed.

Figure 5C:
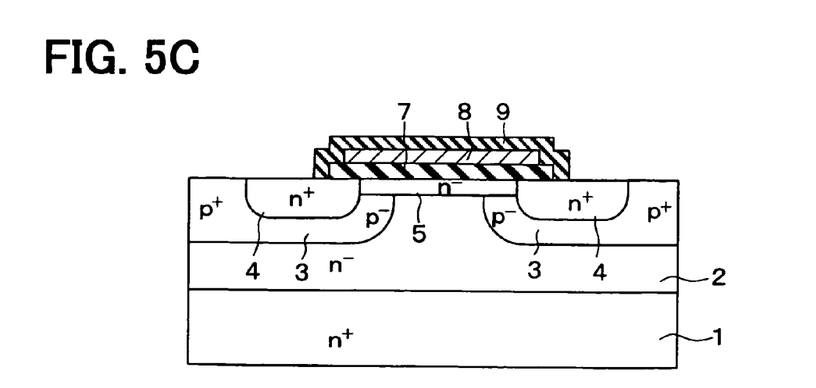

In a step shown in FIG. 5C, after an unnecessary part of the gate oxide film 7 is removed, the insulation film 9 made of LTO is formed at 425° C. Successively, an anneal step at 1000° C. is performed so that the gate electrode 8 is covered with the insulation film 9.

Then, the source electrode 10 and the drain electrode 11 are formed by a metal sputtering method at a room temperature. After deposition of the source electrode 10 and the drain electrode 11, the anneal step at 1000° C. is performed. Thus, the vertical power MOSFET is completed.

The MOSFET works in a normally-off type accumulation mode. Specifically, the operation of the MOSFET will be explained as follows. When a voltage is not applied to the gate electrode 8, the surface channel layer 5 is entirely depleted by an electric potential, which is generated by a difference of work function between the surface channel layer 5 and the gate electrode 8 and by a difference of electrostatic potential between the base region 3 and the surface channel layer 5.

When the voltage is applied to the gate electrode 8, an electric potential difference generated by a sum of the applied voltage and the work function difference between the surface channel layer 5 and the gate electrode 8 is changed. Thus, the channel of the device is controlled.

In case of an off state, the electric field formed by the base region 3 and the gate electrode 8 provides the depletion layer in the surface channel layer 5. Under this condition, when a positive bias voltage is applied to the gate electrode 8, a channel region is formed at a boundary between the gate oxide film 7 and the surface channel layer 5 so that the device switches from the off state to an on state. The channel region extends from the source region 4 to the epitaxial layer 2. Thus, the electrons flows from the source region 4 to the substrate 1, i.e., the drain through the surface channel layer 5 and the epitaxial layer 2, i.e., the drift region. The direction from the epitaxial layer 2 to the substrate 1 is perpendicular to the substrate 1.

Thus, when the positive voltage is applied to the gate electrode 8, an accumulation type channel is induced in the surface channel layer 5 so that a carrier can flow between the source electrode 10 and the drain electrode 11.

In the present embodiment, the carbon layer made of the carbonized resist 21 is used for the anneal step at which the impurity is activated. Then, the carbon layer is removed, and the sacrifice oxidation process is performed such that the sacrifice oxide film is formed on the wafer, and the sacrifice oxide film is removed from the wafer. Thus, when the anneal step for activation of the impurity is performed with using the carbon layer as the mask, a leak path is formed by segregation of the impurity to the top surface portion of the base region 3, which is disposed in a few to five nanometers depth. This leak path is removed by the above method. Thus, the leak current is prevented. The leak current is caused by the leak path on the top surface portion of the impurity layer.

In this embodiment, the high temperature oxidation step for forming the sacrifice oxide film is performed successively after the low temperature oxidation step for removing the carbon layer without decreasing the temperature. In this case, a series of the annealing processes is effectively performed. Alternatively, after the low temperature oxidation step, the temperature of the substrate 1 may be decreased, and then, the high temperature oxidation step may be performed.

Figure 7:
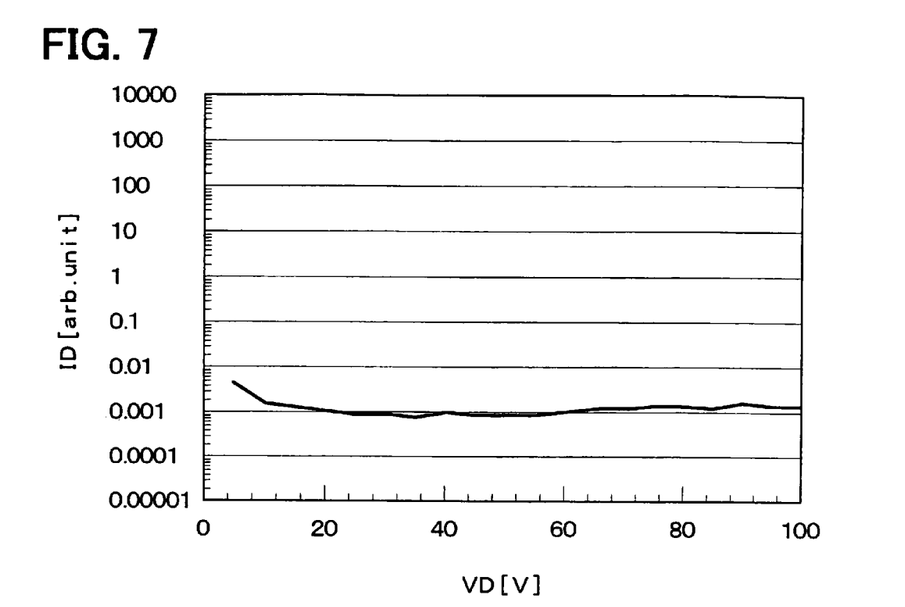
FIG. 7 is a graph showing a relationship between a drain voltage and a drain current in the power MOSFET.

A vertical power MOSFET manufactured by the above method is tested. FIG. 7 shows a result of the test. Specifically, FIG. 7 shows a relationship between a drain voltage VD and a drain current ID in the MOSFET so that a curve in FIG. 7 provides a leak property in the MOSFET. As shown in FIG. 7, even when the drain voltage VD increases, the drain current ID does not change. Thus, no leak current flows in the MOSFET. Accordingly, the above method provides to reduce the leak current.

Second Embodiment

Figure 8A:
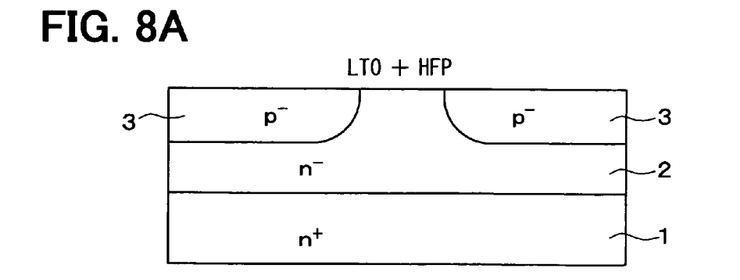
FIGS. 8A to 8B are cross sectional views showing a method for manufacturing a planar MOSFET in a SiC semiconductor device according to a second embodiment.
Figure 8B:
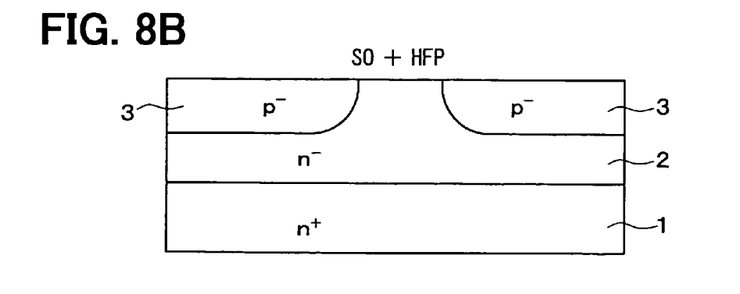

A method for manufacturing a vertical power MOSFET according to a second embodiment is shown in FIGS. 8A and 8B, which correspond to FIG. 3B in the first embodiment. Specifically, the carbon layer removal process and the sacrifice oxidation process in the first embodiment are replaced to other process in the second embodiment.

The anneal process for activating the impurity is performed with using the carbon layer made of the carbonized resist 21 as a mask, as shown in FIGS. 2A to 3A. Then, a step shown in FIG. 8A is performed. In this step, a step for removing the carbon layer, and a HF processing step for cleaning the surface of the substrate 1 are performed. Specifically, similar to FIG. 3B, the low temperature oxidation process is performed to remove the carbon layer. This process is performed such that the thermal oxidation process is performed at temperature equal to or lower than 1000° C., at which the SiC material is not oxidized and the silicon component is not removed. For example, the thermal oxidation process is performed at 800° C., so that the carbon layer burns. Thus, the carbon layer is removed. Then, the temperature of the substrate 1 is decreased. After that, the surface of the wafer is processed by the HF acid so that the surface of the wafer is flattened.

Successively, as shown in FIG. 8B, the sacrifice oxide film is formed on the surface of the wafer in the high temperature oxidation step of the sacrifice oxidation process. Then, the temperature of the substrate 1 is decreased. The step for removing the sacrifice oxide film is performed. Specifically, the sacrifice oxide film is formed in an anneal step at temperature equal to or higher than 1000° C., at which the SiC layer can be oxidized. For example, the anneal step is performed at 1080° C. so that the sacrifice oxide film is formed. Then, the sacrifice oxide film is removed in the HF processing. Further, the HF processing provides to clean the surface of the substrate 1. Thus, the carbon layer made of carbonized resist is used as the mask when the impurity is activated in the anneal step. At this time, a leak path formed by migration of the impurity to a top surface portion of the base region 3 is removed. Here, the top surface portion is disposed in a few to five nanometers. Accordingly, a leak current can be reduced. The leak current is attributed to the leak path in the top surface portion of the impurity layer.

In this embodiment, the HF processing is performed after the step for removing the carbon layer. Further, the HF processing is additionally performed after the sacrifice oxidation process. Accordingly, by performing the HF processing after the carbon layer is removed, the surface of the wafer is much cleaned. Thus, influence of speed multiplication oxidation in the sacrifice oxidation process is much reduced.

Other Embodiments

In the first embodiment, the annealing process for carbonizing the resist 23 and for activating the impurity is performed in argon gas atmosphere. Alternatively, the annealing process may be performed in decompressed atmosphere such as in vacuum so that residual oxygen partial pressure is small. In this case, since the residual oxygen contributes to burn the resist 23 or the carbon layer, the residual oxygen percentage is set to be equal to or smaller than 1%.

Alternatively, the residual oxygen gas may be replaced with the argon gas so that the residual oxygen is reduced in the atmosphere, in which the annealing process is performed. In this case, to reduce the residual oxygen gas sufficiently, multiple replacing steps with the argon gas are performed. In the inventor's experiment, when the number of replacing steps is equal to or larger than three, the residual oxygen gas is sufficiently reduced so that the resist 23 and the carbon layer does not burn substantially.

In the first embodiment, the annealing process profile for carbonizing the resist 23 so as to form the carbon layer is different from that for activating the impurity. Thus, multiple annealing process profiles are prepared so that the carbon layer is effectively formed.

Alternatively, the annealing process profile for forming the carbon layer may be the same as that for activating the impurity. For example, the resist 23 may be carbonized by heating with the temperature increase rate of 160° C./min, which is the same as that in the annealing process profile for activating the impurity. In this case, the carbon layer may be broken by boiling of the organic matter although the manufacturing process is simplified. Alternatively, the impurity may be activated by heating with the temperature increase rate equal to or smaller than 80° C./min up to 1600° C., the temperature increase rate which is the same as that in the annealing process profile for forming the carbon layer. In this case, the process time duration may be longer although the manufacturing process is simplified.

Figure 9:
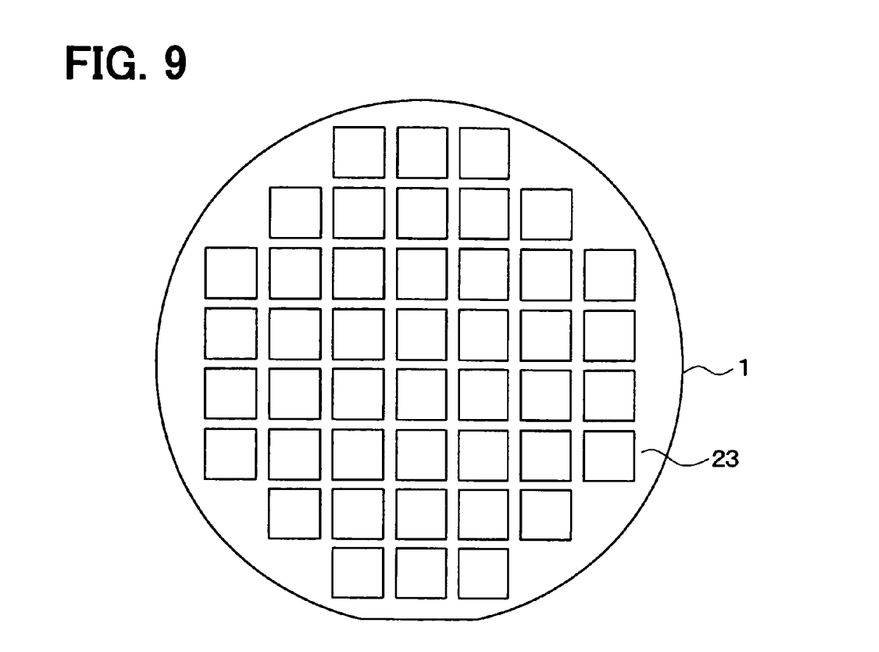
FIG. 9 is a plan view showing a wafer with multiple parts of a carbon layer.

In the first embodiment, the resist 23 is formed on whole surface of the substrate 1. Alternatively, as shown in FIG. 9, the resist 23 may be divided into multiple parts, each of which corresponds to a semiconductor chip. Specifically, the wafer includes multiple chips, and one chip corresponds to one SiC semiconductor device. The dimensions of the chip are, for example, three millimeters square. And, each part of the resist 23 covers the one chip. In this case, since the area of the resist 23 is divided to small areas. Therefore, the resist 23 does not easily tear.

Figure 10:
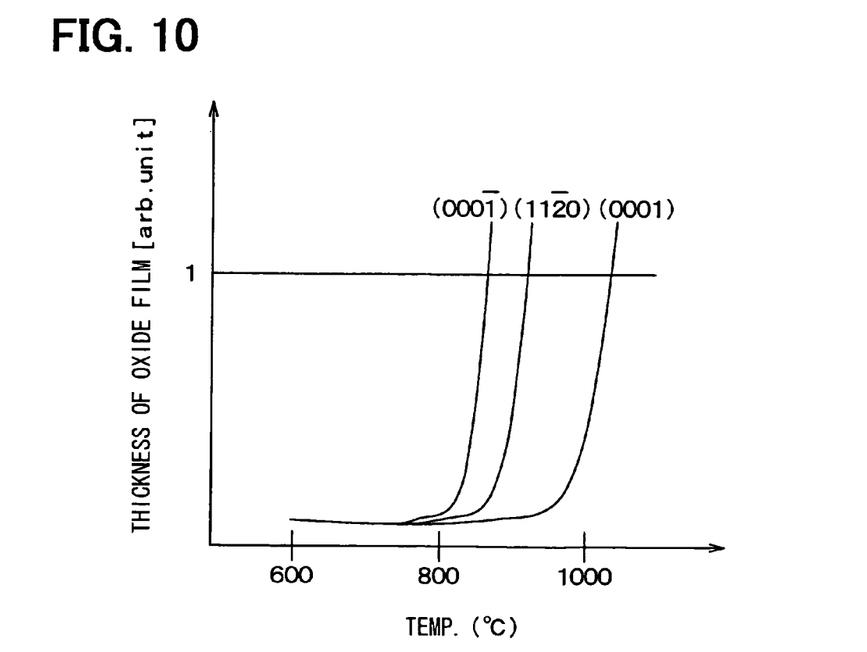
FIG. 10 is a graph showing a relationship between a thickness of an oxide film and an annealing temperature in various surface orientations.

In the first and second embodiments, a surface orientation of the substrate 1 is not specified. It is preferred for the substrate to specify the surface orientation in view of surface orientation dependency of oxidation thickness. FIG. 10 shows three curves of the surface orientation dependency of oxidation thickness. When the surface orientation of the substrate 1 is (000-1)-orientation, (11-20)-orientation or (0001)-orientation, a thickness of a formed oxide film is different even when the anneal temperature is the same. Accordingly, when the thickness of the oxide film is required to be thin, the surface orientation of the substrate 1 is set to be the (000-1)-orientation or the (11-20)-orientation rather than the (0001)-orientation.

Although the SiC semiconductor device includes the vertical power MOSFET, the SiC semiconductor device may include other devices as far as an oxide film is formed on the surface of the SiC material including an impurity to prevent the concavity from being formed by speed multiplication oxidation.

The above disclosure has the following aspects.

According to an aspect of the present disclosure, a method for manufacturing a SiC semiconductor device includes: forming an impurity layer in a SiC semiconductor layer; and forming an oxide film on a surface of the SiC semiconductor layer. The forming the impurity layer includes: implanting an impurity in the SiC semiconductor layer; applying a cap layer made of organic solvent on the surface of the SiC semiconductor layer; annealing the cap layer to evaporate the organic solvent so that the cap layer is carbonized and transformed to a carbon layer; annealing the SiC semiconductor layer to activate the impurity in the SiC semiconductor layer under a condition that the surface of the SiC semiconductor layer is covered with the carbon layer; removing the carbon layer; and performing a sacrifice oxidation process after the removing the carbon layer. The performing the sacrifice oxidation process includes: forming a sacrifice oxide film; and removing the sacrifice oxide film. The forming the oxide film is performed after the performing the sacrifice oxidation process.

In the above method, the impurity is activated with covering the surface of the SiC semiconductor layer, and then, the carbon layer is removed. Further, the sacrifice oxidation process is performed. Thus, even if a leak path is formed in a top surface of the SiC semiconductor layer, the leak path is removed in the removing the carbon layer and the sacrifice oxidation process. Thus, a leak current is prevented in the SiC semiconductor device.

Alternatively, the removing the carbon layer may include: oxidizing the carbon layer at a first temperature so that the carbon layer is removed. The first temperature is lower than a temperature, at which the SiC semiconductor layer is oxidized. The forming the sacrifice oxide film may include: oxidizing the SiC semiconductor layer at a second temperature so that the sacrifice oxide film is formed. The second temperature is higher than the first temperature. Further, the first temperature may be lower than 1000° C., and the second temperature may be equal to or higher than 1000° C. Further, the oxidizing the SiC semiconductor layer may be performed sequentially with the oxidizing the carbon layer so that a temperature of the SiC semiconductor layer is increased from the first temperature to the second temperature without reducing the temperature. Further, the removing the sacrifice oxide film may include: processing the surface of the SiC semiconductor layer with HF acid after the oxidizing the SiC semiconductor layer. Further, the oxidizing the SiC semiconductor layer may be performed independently from the oxidizing the carbon layer. The removing the carbon layer further includes: decreasing a temperature of the SiC semiconductor layer after the oxidizing the carbon layer, and the oxidizing the SiC semiconductor layer is performed after the decreasing the temperature of the SiC semiconductor layer. Furthermore, the removing the carbon layer may further include: processing the surface of the SiC semiconductor layer with HF acid after the oxidizing the carbon layer, and the removing the sacrifice oxide film may further include: processing the surface of the SiC semiconductor layer with HF acid after the oxidizing the SiC semiconductor layer.

Alternatively, the cap layer may be made of an I-line photo lithography resist, a deep-UV lithography resist, an ArF lithography resist or an electron beam lithography resist. The annealing the cap layer has a temperature increase rate equal to or smaller than 80° C./min. The annealing the cap layer includes: setting atmosphere around the SiC semiconductor device to include oxygen gas equal to or smaller than 1%; increasing a temperature of the cap layer to a third temperature; and maintaining the temperature of the SiC semiconductor layer at the third temperature for a predetermined time duration equal to or greater than ten minutes. The third temperature is in a range between 200° C. and 850° C. Further, the annealing the SiC semiconductor layer may be performed at a fourth temperature equal to or lower than 1800° C. for another predetermined time duration equal to or greater than thirty minutes. Furthermore, the surface of the SiC semiconductor layer may have a (000-1)-orientation or a (11-20)-orientation.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a SiC semiconductor device comprising:
   forming an impurity layer in a SiC semiconductor layer; and
   forming an oxide film on a surface of the SiC semiconductor layer, wherein
   the forming the impurity layer includes:
      implanting an impurity in the SiC semiconductor layer;
      applying a cap layer made of organic solvent on the surface of the SiC semiconductor layer;
      annealing the cap layer and evaporating the organic solvent whereby the cap layer is carbonized and transformed into a carbon layer;
      annealing the SiC semiconductor layer and activating the impurity in the SiC semiconductor layer under a condition that the surface of the SiC semiconductor layer is covered with the carbon layer;
      removing the carbon layer; and
      performing a sacrifice oxidation process after the removing the carbon layer,
   the performing the sacrifice oxidation process includes forming a sacrifice oxide film and removing the sacrifice oxide film,
   the forming the oxide film on the surface of the SiC semiconductor layer is performed after the performing the sacrifice oxidation process,
   the removing the carbon layer includes oxidizing the carbon layer at a first temperature so that the carbon layer is removed,
   the first temperature is lower than a temperature at which the SiC semiconductor layer is oxidized,
   the forming the sacrifice oxide film includes oxidizing the SiC semiconductor layer at a second temperature so that the sacrifice oxide film is formed,
   the second temperature is higher than the first temperature,
   the oxidizing the SiC semiconductor layer is performed sequentially with the oxidizing the carbon layer whereby a temperature of the SiC semiconductor layer is increased from the first temperature to the second temperature without reducing the temperature.

2. The method according to claim 1, wherein
the first temperature is lower than 1000° C., and
the second temperature is equal to or higher than 1000° C.

3. The method according to claim 1, wherein
the removing the sacrifice oxide film includes: processing the surface of the SiC semiconductor layer with HF acid after the oxidizing the SiC semiconductor layer.

4. The method according to claim 1, wherein
the oxidizing the SiC semiconductor layer is performed independently from the oxidizing the carbon layer,
the removing the carbon layer further includes: decreasing a temperature of the SiC semiconductor layer after the oxidizing the carbon layer, and
the oxidizing the SiC semiconductor layer is performed after the decreasing the temperature of the SiC semiconductor layer.

5. The method according to claim 4, wherein
the removing the carbon layer further includes: processing the surface of the SiC semiconductor layer with HF acid after the oxidizing the carbon layer, and
the removing the sacrifice oxide film further includes: processing the surface of the SiC semiconductor layer with HF acid after the oxidizing the SiC semiconductor layer.

6. The method according to claim 1, wherein
the cap layer is made of an I-line photo lithography resist, a deep-UV lithography resist, an ArF lithography resist or an electron beam lithography resist,
the annealing the cap layer has a temperature increase rate equal to or smaller than 80° C./min,
the annealing the cap layer includes:
setting atmosphere around the SiC semiconductor device to include oxygen gas equal to or smaller than 1%;
increasing a temperature of the cap layer to a third temperature; and
maintaining the temperature of the SiC semiconductor layer at the third temperature for a predetermined time duration equal to or greater than ten minutes, and
the third temperature is in a range between 200° C. and 850° C.

7. The method according to claim 6, wherein
the annealing the SiC semiconductor layer is performed at a fourth temperature equal to or lower than 1800° C. for another predetermined time duration equal to or greater than thirty minutes.

8. The method according to claim 7, wherein
the surface of the SiC semiconductor layer has a (000-1)-orientation or a (11-20)-orientation.

* * * * *